United States Patent [19]

Okabe

[11] Patent Number: 5,818,810
[45] Date of Patent: Oct. 6, 1998

[54] IMAGE READER SYSTEM

[75] Inventor: Masato Okabe, Tokyo, Japan

[73] Assignee: Dai Nippon Printing Co., Ltd., Tokyo, Japan

[21] Appl. No.: 494,770

[22] Filed: Jun. 26, 1995

[30] Foreign Application Priority Data

Jun. 27, 1994 [JP] Japan ................................. 6-144814

[51] Int. Cl.$^6$ ...................................................... G11B 7/00
[52] U.S. Cl. ........................ 369/126; 369/103; 369/275.1
[58] Field of Search .......................... 359/72, 41; 369/59, 369/275.2, 58, 47, 120, 126, 111, 275.1, 103, 100; 250/331; 365/108; 430/20, 31, 48

[56] References Cited

U.S. PATENT DOCUMENTS 5,339,306  8/1994  Yoshinaga et al. ................. 369/100 X
5,594,713  1/1997  Komma et al. ..................... 369/103 X

*Primary Examiner*—Muhammad N. Edun
*Attorney, Agent, or Firm*—Sughrue, Mion, Zinn, Macpeak & Seas, PLLC

[57] ABSTRACT

An image reader system for reading an image recorded on a polymer dispersed type of liquid crystal recording medium in which liquid crystals are dispersed and fixed in resin is provided. Illumination light is directed from a point light source to the liquid crystal recording medium to read the recorded image by a photoelectric conversion element through an optical system with the liquid crystal recording medium defining an object plane and the photoelectric conversion element defining an imaginary plane. Any lowering of contrast is avoided and the image can be read with high precision.

18 Claims, 5 Drawing Sheets

(a)                           (b)

IMAGE READER SYSTEM

BACKGROUND OF THE INVENTION

1. Field of the Invention

The present invention relates to an image reader system for reading an image recorded on a polymer dispersed type of liquid crystal recording medium in which liquid crystals are dispersed and fixed in resin.

2. Prior Art

Among systems so far known for recording images by exposure to light at an applied voltage, there is a system in which a polymer dispersed type of liquid crystal recording medium including on an electrode a liquid crystal layer with liquid crystals dispersed and fixed in resin is located in opposition to a photoelectric sensor including a photoconductive layer on an electrode layer.

One exemplary construction of an image recorder using such a polymer dispersed type of liquid crystal recording medium is schematically shown in FIG. 1, wherein reference numeral 10 represents a photoelectric sensor and a liquid crystal recording medium 20 is shown in FIG. 1(b). The photoelectric sensor 10 is formed by stacking a transparent electrode 12 and a photoconductive layer 13 on a transparent substrate 11 in the described order, and the liquid crystal recording medium 20 is formed by stacking a transparent electrode 22 and a polymer dispersed type of liquid crystal layer 23 on a transparent substrate 21 in the described order. The photoconductive layer 13 used may be a single layer consisting of an inorganic photoconductive layer such as an amorphous selenium, amorphous silicon or other layer, or an organic layer consisting of polyvinyl carbazole and trinitrofluorenone added thereto, or a composite layer consisting of a laminate comprising a carrier generation layer in which an azo type dye is mixed with a resin such as polyvinyl butyral and a carrier transport layer in which a hydrazone derivative is mixed with a resin such as polycarbonate.

In the recording system shown in FIG. 1, the photoelectric sensor is opposed to the liquid crystal recording medium, with a gap of about 10 $\mu$m located between them using a spacer of polyethylene, polyimide or the like, and exposed to light at an applied voltage. A laminated structure comprising a photoelectric sensor and a liquid crystal recording medium is also proposed, as shown in FIGS. 2(a) and 2(b). In this laminated type recording medium, the liquid crystal recording layer may be laminated directly on the photoelectric sensor (FIG. 2(a)), or an intermediate dielectric layer 24 may be interposed between them (FIG. 2(b)).

Voltage is applied between electrodes 12 and 22 of the photoelectric sensor 10 and liquid crystal recording medium 20 opposed to each other from a power source 30, as shown in FIG. 3, while the photoelectric sensor 10 is exposed to visible light for writing light. Thereupon, there is a change in the conductivity of the photoconductive layer 13 depending on the intensity of the light, which in turn gives rise to a change in an electric field applied on the liquid crystal layer 23 and, hence, in the orientation of liquid crystal in the liquid crystal layer. Even after the application of voltage is put off for removal of the electric field, the liquid crystal remains oriented to record image information.

As typically shown in FIG. 4, the thus recorded image information is read by irradiating the liquid crystal recording medium 20 with reading light from a light source 40 and converting the transmitted light by a photoelectric converter 60 into an electric signal. For the light source 40, a white light source such as a xenon or halogen lamp or laser light may be used, and for the light to be directed to the liquid crystal recording medium, it is preferable to use light of suitable wavelength selected by a filter 50. The incident light is modulated by the orientation of liquid crystals in the liquid crystal layer of the liquid crystal recording medium, the transmitted light is converted into an electric signal by the photoelectric converter 60 comprising photodiodes, etc., and the resultant electric signal is printed out or displayed on a CRT, if required.

A typical example of the means for reading the visible image—that has been recorded in the form of a permeability change—in the form of an electric signal is a film scanner for silver salt photography. A problem with using the film scanner to read the image recorded on the liquid crystal recording medium, however, is that no image of good quality is obtained because the non-oriented zone has high transmittance and so is low in contrast with respect to the oriented zone. It is somehow possible to convert the read image data by image processing into image data of an enhanced contrast. However, this leads to another problem that a sensitivity variation of a charge-coupled-device (CCD) sensor manifests itself by image processing, resulting in streaks in the sub-scanning line direction.

The sensitivity variation of the CCD sensor may be reduced by signal processing, but it has difficulty in correction when there is a large illuminance variation on the CCD sensor. The illuminance variation on the CCD sensor is caused by a light source and an optical system located between them. To reduce this illuminance variation, a diffusing plate is provided in the case of the film scanner for silver salt photography, thereby standardizing the quantity of light.

One possible example of applying such a diffusing plate to reading images from the liquid crystal recording medium is shown in FIG. 5. As illustrated, light is directed to a liquid crystal recording medium 20 with an image recorded on it through an optical system consisting of a xenon lamp 30, a diffusing plate 70, an infrared cutoff filter 41, a band-pass filter 42 and a lens 51 to focus the transmitted light through an image-forming lens 52 on a CCD line sensor 60. The presence of the diffusing plate 70 allows the light from the light source 30 to be diffused uniformly in every direction, so that the illuminance variation on the CCD sensor can be reduced.

The liquid crystal recording medium 20 and CCD line sensor 60 define an object plane and an imaginary plane relative to the image-forming lens 52, and the diffused light is so to speak, a multi-light source. When a scattering medium like a liquid crystal recording medium is irradiated with light coming from various directions (a multi-light source), the object plane does not correspond to the imaginary plane at 1:1. In other words, light scattered by pixels of the liquid crystal recording medium at different positions, too, is detected by each pixel of the CCD sensor for standardization. This gives rise to a problem that the contrast and resolution of the read image become worse.

In view of the problems mentioned above, it is an object of the present invention to provide an image reader system that can prevent a lowering of the contrast of the read image and enables an image to be read with high precision.

SUMMARY OF THE INVENTION

In the liquid crystal recording medium used in the present invention, the recording surface provides strong diffusion of light, so that when irradiated with diffused light, diffused light coming from various places of the recording layer is incident on one pixel of a CCD sensor for standardization, resulting in contrast and resolution drops.

To obtain image data of high precision, it is preferable to use a point light source as the light source and to eliminate a diffusing plate from an illumination optical system. For such a light source, a xenon lamp with a short gap distance is desired. Other light source, e.g., a halogen lamp may be used in the form of a point light source, if an iris diaphragm of about 1 to 2 ø is used in combination therewith. In this case, too, it is possible to read images with high precision.

More specifically, the present invention provides an image reader system wherein an image recorded on a polymer dispersed type of liquid crystal recording medium in which liquid crystals are dispersed and fixed in resin is converted into an electric signal, characterized in that illumination light is directed from a point light source to the liquid crystal recording medium to focus the recorded image on a photoelectric conversion element through an optical system with the liquid crystal recording medium defining an object plane and the photoelectric conversion element defining an imaginary plane.

According to the present invention, a liquid crystal recording medium 20 is illuminated with light through an optical system consisting of a xenon lamp 30, an infrared cutoff filter 41, a band-pass filter 42 and a lens 51, and an image is formed by an image-forming lens 52 on a CCD line sensor 60, as shown in FIG. 6. Since the light source 30 can be taken as a point light source, the object plane corresponds to the imaginary plane at 1:1. Due to the absence of any light diffused from different positions of each pixel, it is possible to prevent any lowering of the contrast of the read image and so read the image with high precision.

Alternatively or as shown in FIG. 7, a slit 61 may be located in front of (or in the rear of) the liquid crystal recording medium so that the recorded region can be read while a stage (not shown) is moved with the liquid crystal recording medium placed thereon. In this embodiment, the contrast of the read image can be much more enhanced.

In the image reader according to the present invention, it is desired that the intensity distribution of the illumination light be as uniform as possible. Referring here to the illuminance distribution of the light directed on the CCD sensor, it is desired that the minimum illuminance be at least 70% of the maximum illuminance.

According to the present invention wherein the liquid crystal recording medium is illuminated with light from the point light source so that the recorded image can be formed on the photoelectric conversion element through the optical system with the liquid crystal recording medium defining an object plane and the photoelectric conversion element defining an imaginary plane, it is possible to prevent any lowering of contrast and read an image with high precision.

BRIEF DESCRIPTION OF THE DRAWINGS

By way of example but not by way of limitation, the image reader system of the present invention will now be explained at great length with reference to the accompanying drawings, in which.

Fabrication of Liquid Crystal Recording Medium

EXAMPLE 1

Figure 1:
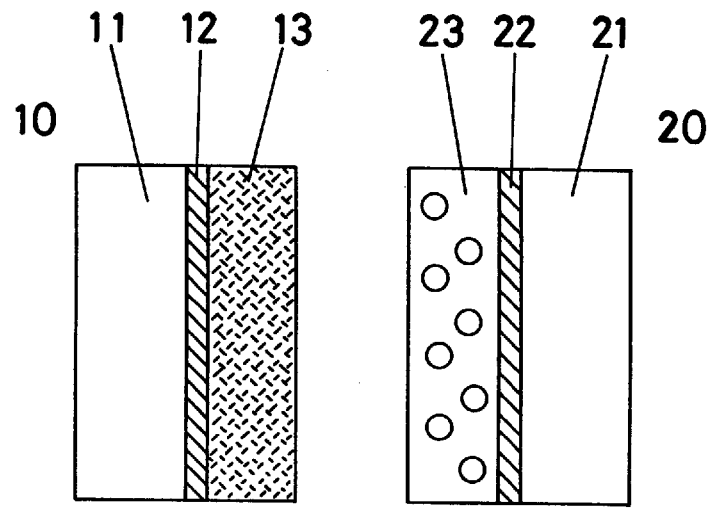
FIG. 1 is a schematic of one example of the liquid crystal recording medium.
Figure 2:
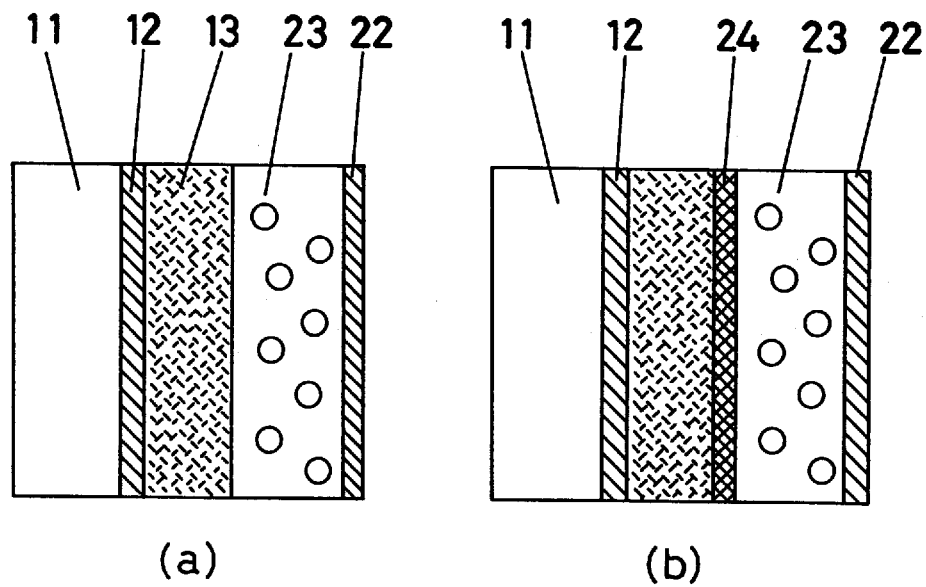
FIG. 2(a) and (b) are schematics of another example of the liquid crystal recording medium.
Figure 3:
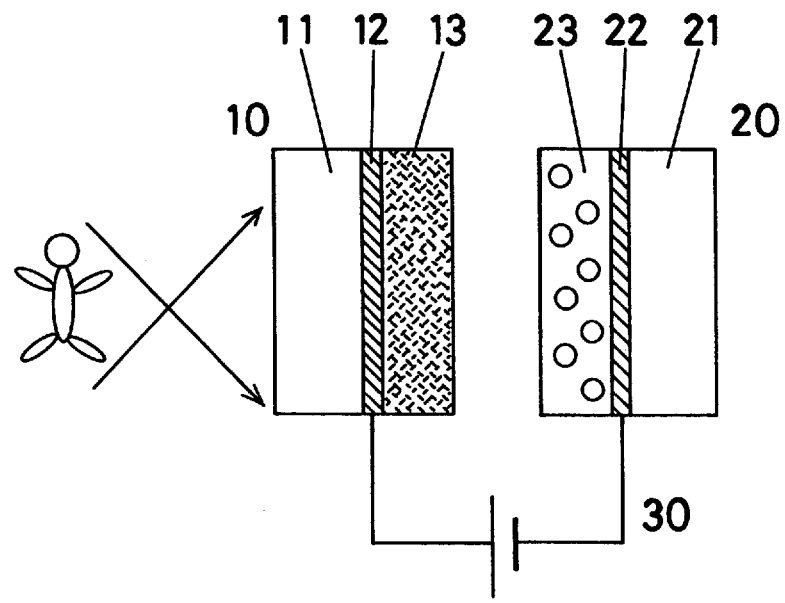
FIG. 3 is a schematic of how to record an image.
Figure 4:
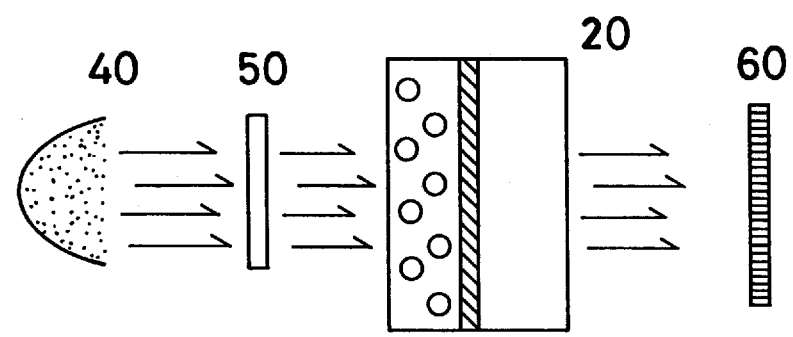
FIG. 4 is a schematic of how to read an image.

Four (4) parts of dipentaerythritol hexaacrylate, 6 parts of smectic liquid crystals (S6 manufactured by Merck & Co., Inc.), 0.2 parts of a fluorine surface active agent (Fluorad FC-430 manufactured by 3M Co., Ltd.) and 0.2 parts of a photopolymerization initiator (Darocure 1173 manufactured by Merck & Co., Inc.) were mixed together to form a mixture, which was then formulated with xylene to a solid content of 30%.

This solution was coated on the side of a glass substrate—on which an ITO transparent electrode having a thickness of about 500 Å and a resistance value of 80 Ω/□ had been formed, using a blade coater with a gap thickness of 50 μm. Upon being held at 50° C., the substrate was irradiated with ultraviolet light of 0.3 J/cm$^2$ to fabricate an information recording medium having an information recording layer of about 6 μm in thickness. A section of this information recording medium was extracted with hot ethanol for liquid crystal extraction, and then dried. Afterwards, the observation of the internal structure of the recording layer by a scanning electron microscope of 10,000 magnifications (S-800 manufactured by Hitachi, Ltd.) showed that the recording layer is covered on the surface with a 0.6 μm thick ultraviolet cured resin and filled inside with resin particles having a particle diameter of 0.1 μm.

Fabrication of Photoelectric Sensor

EXAMPLE 2

Three (3) parts of a carrier generation substance or fluorenone azo dye having the following structure and 1 part of polyester resin were mixed with 196 parts of a mixed solvent consisting of dioxane and cyclohexanone at 1:1, and the mixture was subsequently well mixed in a mixer to prepare a coating solution.

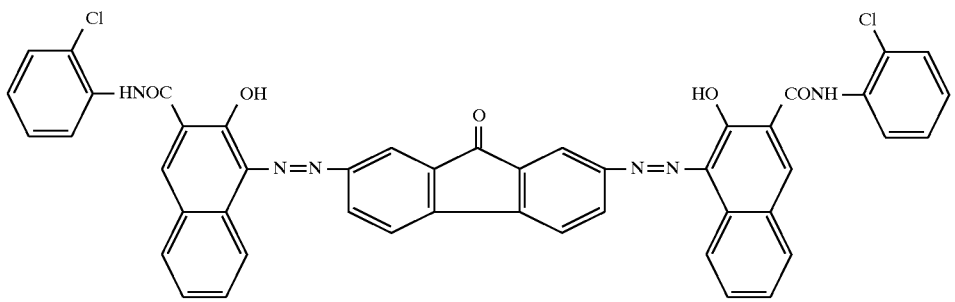

This solution was coated on the side of a glass substrate on which an ITO transparent electrode having a thickness of about 500 Å and a resistance value of 80 Ω/□ had been formed, and then dried at 100° C. for 1 hour to form a carrier generation layer of 0.3 μm in thickness.

Next, 3 parts of a carrier transport layer or paradimethylstilbene having the following structure and 1 part of polystyrene resin were mixed with, and dissolved in, 170 parts of a mixed solvent consisting of dichloromethane and 1,2-trichloroethane at 68:102 to prepare a coating solution.

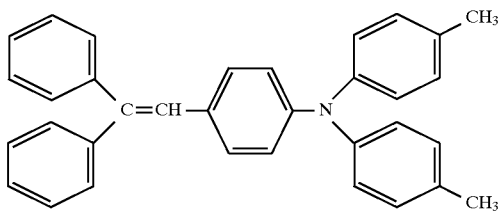

This solution was coated on the above carrier generation layer, and then dried at 80° C. for 2 hours to form a carrier transport layer of 10 μm in thickness.

Image Recording

EXAMPLE 3

Using a corona charger, the liquid crystal recording medium fabricated in Example 1 was charged all over the surface until the liquid crystals were completely oriented, thereby making the whole uniformly transparent. The medium was heated by a thermal head of a thermal printer until the liquid crystals reached an isotropic phase transition temperature, and then cooled. It was then found that the portion of the medium heated have non-oriented liquid crystals and thus decreases in transmittance.

EXAMPLE 4

The liquid crystal recording medium of Example 1 was opposed to the photoelectric sensor fabricated in Example 2 with an air gap of about 10 μm located between them, using a polyimide film spacer. While light was directed to the medium through the photoelectric sensor, a voltage of 720 V was applied between the electrodes of the medium and sensor for 40 msec. It was then found that the transmittance of the liquid crystal recording layer changes depending on the intensity of the light.

EXAMPLE 5

Figure 6:
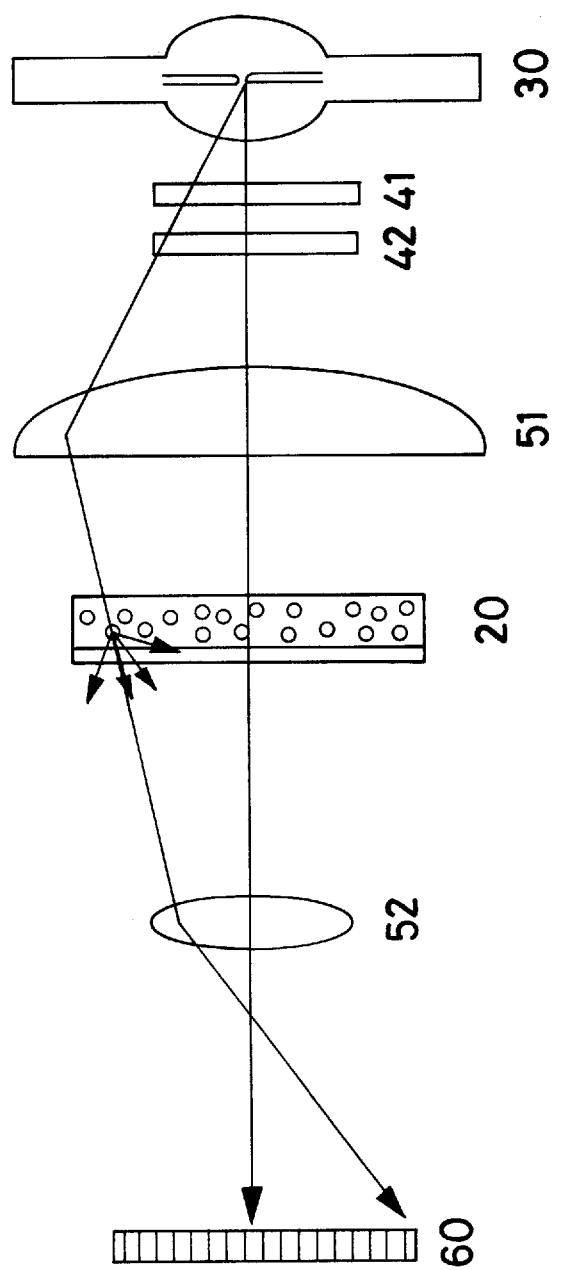
FIG. 6 is a schematic of how to read an image using a point light source.

The liquid crystal recording medium 20 with information recorded on it according to Example 3 or 4 was irradiated with light of 365-nm wavelength by such an optical system as shown in FIG. 6, the transmitted light was focused by the image-forming lens 52 on the CCD line sensor 60, and the transmitted light was measured to observe the resultant signal on an oscilloscope. The signal was found to have a minimum value of about 10 vs. the assumed maximum value of 100.

The lens 51 used was a plano-convex lens formed of synthetic quartz, which had an outer diameter of 80 mm and a focal length of 100 mm, while the image-forming lens 52 used was UV Nikol made by Nikon Co., Ltd.

COMPARATIVE EXAMPLE 1

Figure 5:
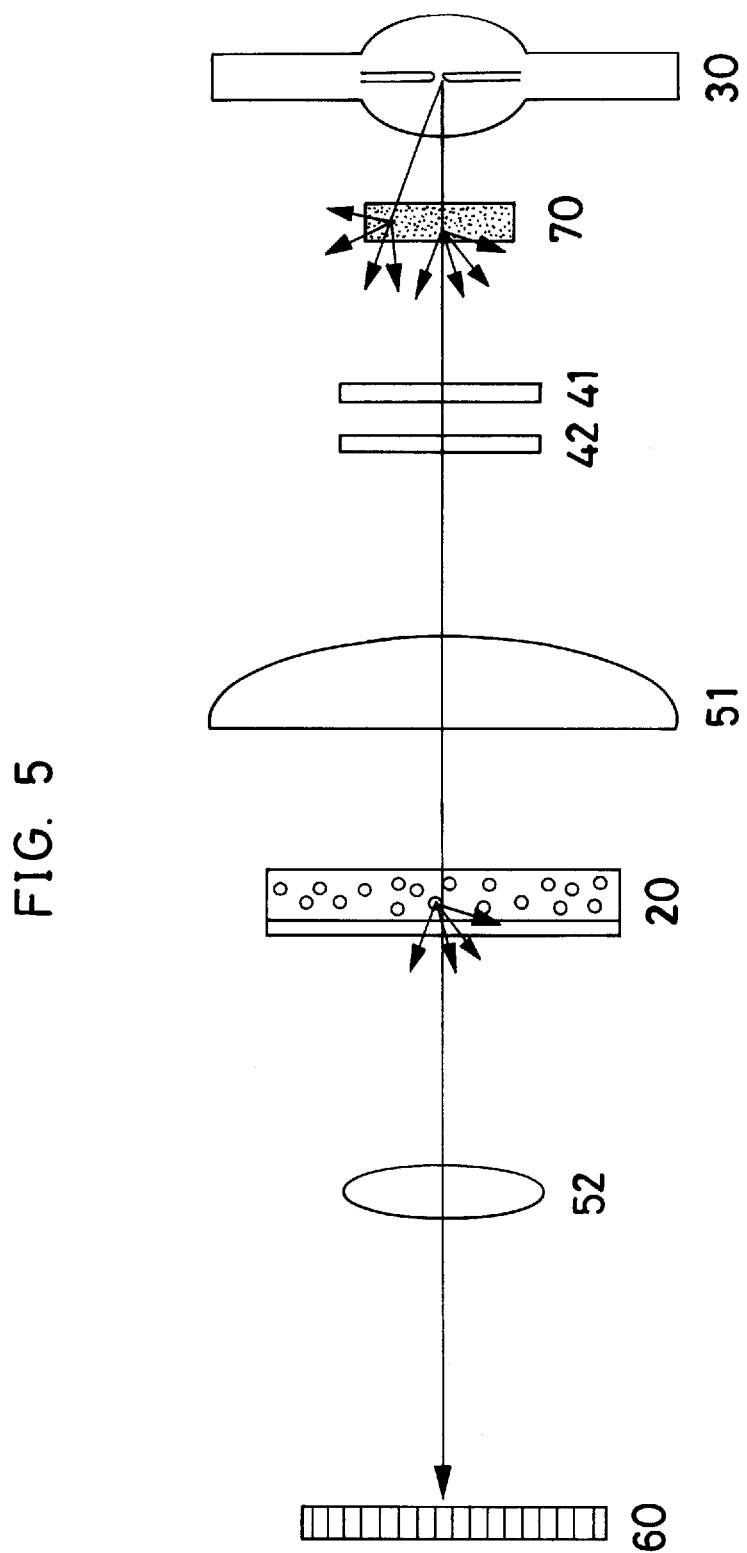
FIG. 5 is a schematic of how to read an image using a diffusing plate.

The liquid crystal recording medium 20 with information recorded on it according to Example 3 or 4 was irradiated with light of 365-nm wavelength by such an optical system as shown in FIG. 5, the transmitted light was focused by the image-forming lens 52 on the CCD line sensor 60, and the transmitted light was measured to observe the resultant signal on an oscilloscope. The signal was found to have a minimum value of 50 vs. the assumed maximum value of 100. The lenses 51 and 52 used were the same as used in Example 5.

EXAMPLE 6

Figure 7:
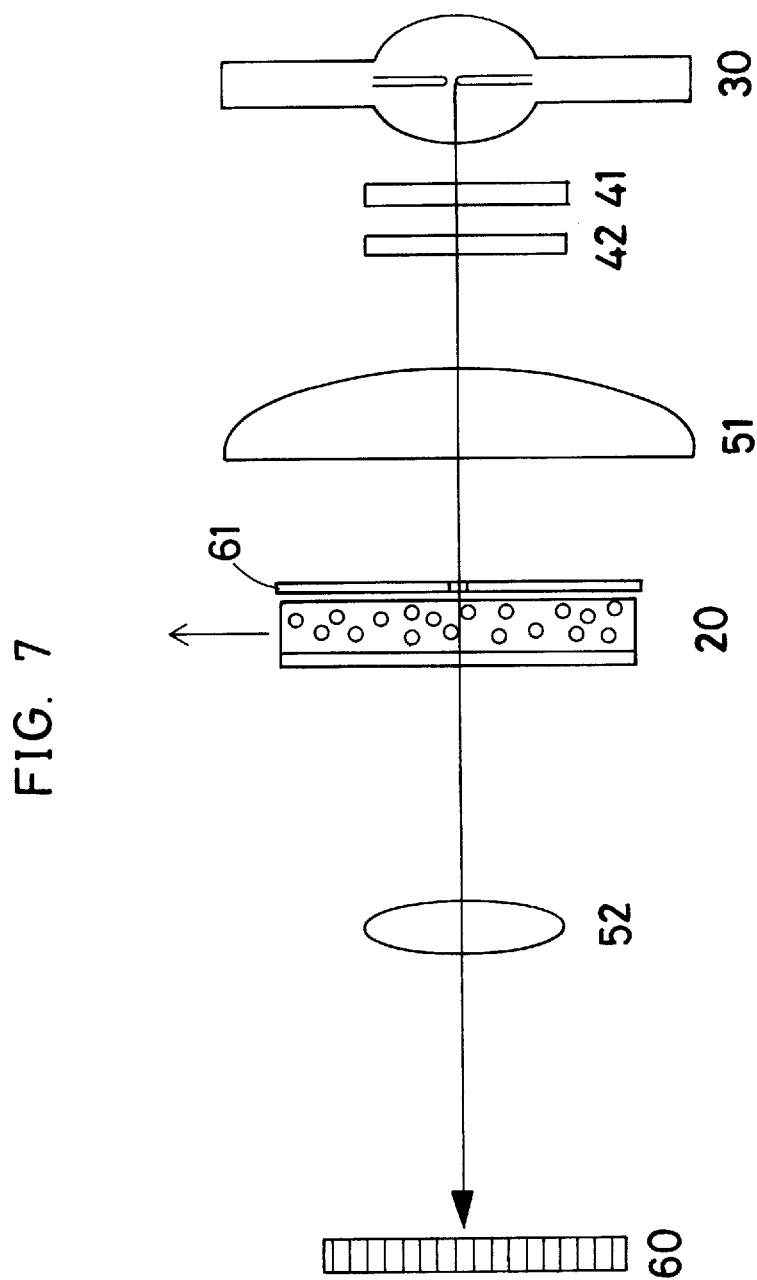
FIG. 7 is a schematic of how to read an image using a point light source plus a slit.

In an optical system including the slit 61 as shown in FIG. 7, the liquid crystal medium with information recorded on it according to Example 3 or 4 was fixed on a stage movable vertically to the optical axis. While the transmitted light was measured according to Example 5, the stage was so moved that while signals were converted to 8-bit digital signals, read signals were recorded all over the region with the image recorded thereon. After data conversion was performed with a minimum value of 0 and a maximum value of 256, it was found that an image of excellent resolution can be obtained on a display.

COMPARATIVE EXAMPLE 2

An image was read all over the region with image information recorded thereon according to Example 6, using the image reader of the same optical arrangement as in Comparative Example 1. After data conversion was performed with a minimum value of 0 and a maximum value of 256, it was found that the resolution of the image displayed is inferior to that obtained in Example 6.

EXAMPLE 7

The optical system of Example 5 was regulated such that the liquid crystal recording medium and the transmitted image formed on the surface of the CCD sensor lay at 1:1. While the liquid crystal recording medium was removed from the optical system, the intensity distribution of the illumination light was measured over a length of 30 mm. It was then found that the minimum value of the intensity of the illumination light is about 90% of the maximum value.

According to the image reader system of the present invention wherein, as mentioned above, light diffused by pixels at different positions of the liquid crystal recording medium is eliminated by reading an image with illumination light from a point light source, it is possible to prevent any lowering of the contrast of the image and achieve the image with high precision. The illuminance distribution of light directed on the CCD sensor is regulated such that the minimum illuminance is at least 70% of the maximum illuminance, so that high-precision reading can be achieved.

What is claimed is:

1. An image reader system for reading an image recorded on a polymer dispersed type of liquid crystal recording medium in which liquid crystals are dispersed and fixed in resin, wherein illumination light is directed from a point light source to the liquid crystal recording medium to read the recorded image by a photoelectric conversion element through an optical system with the liquid crystal recording medium defining an object plane and the photoelectric conversion element defining an imaginary plane.

2. The image reader system according to claim 1, wherein said illumination light is directed through a slit located in front of the liquid crystal recording medium so that the image can be read while the liquid crystal recording medium is moving.

3. The image reader system according to claim 1, wherein said photoelectric conversion element is a CCD line sensor, and said optical system, upon removal of said liquid crystal recording medium, has an illuminance distribution of light directed on the CCD sensor such that the minimum illuminance is at least 70% of the maximum illuminance.

4. The image reader system according to claim 1, wherein said illumination light is directed through a slit located in the rear of the liquid crystal recording medium so that the image can be read while the liquid crystal recording medium is moving.

5. The image reader system according to claim 1, wherein said point light source comprises a xenon lamp.

6. The image reader system according to claim 1, wherein said point light source comprises a halogen lamp.

7. The image reader system according to claim 6, wherein said point light source further comprises an iris diaphragm.

8. The image reader system according to claim 1, further comprising an infrared cutoff filter located between said point source and said liquid crystal recording medium and through which said illumination light is directed.

9. The image reader system according to claim 1, further comprising a band-pass filter located between said point source and said liquid crystal recording medium and through which said illumination light is directed.

10. The image reader system according to claim 9, further comprising a band-pass filter located between said cutoff filter and said liquid crystal recording medium and through which said illumination light is directed.

11. The image reader system according to claim 1, further comprising a lens located between said point source and said liquid crystal recording medium and through which the illumination light is directed.

12. The image reader system according to claim 11, wherein the lens is a plano-convex lens formed of synthetic quartz having an outer diameter of 88 mm and a focal length of 100 mm.

13. The image reader system according to claim 1, wherein said optical system comprises an image-forming lens located between said liquid crystal recording medium and said photoelectric conversion element and through which the illumination light is directed.

14. The image reader system according to claim 13, wherein said image-forming lens is a UV Nikol lens.

15. The image reader system according to claim 1, wherein said photoelectric conversion element comprises a photoelectric sensor including a carrier transport layer with a thickness of approximately 10 $\mu$m coated on a carrier generation layer with a thickness of approximately 0.3 $\mu$m.

16. The image reader system according to claim 1, wherein said photoelectric conversion element is opposed to said liquid crystal recording medium with an air gap of approximately 10 $\mu$m therebetween using a polyimide film spacer.

17. The image reader system according to claim 1, wherein said liquid crystal medium is fixed on a stage that is movable vertically in relation to an optical axis of the illumination light.

18. The image reader system according to claim 1, further comprising a diffusing plate located between said point source and said liquid crystal recording medium and through which said illumination light is directed.

* * * * *